United States Patent [19]
Iketani et al.

[11] Patent Number: 5,764,573
[45] Date of Patent: Jun. 9, 1998

[54] SEMICONDUCTOR DEVICE CAPABLE OF EXTERNALLY AND READILY IDENTIFYING SET BONDING OPTIONAL FUNCTION AND METHOD OF IDENTIFYING INTERNAL FUNCTION OF SEMICONDUCTOR DEVICE

[75] Inventors: Masayuki Iketani; Shigeki Ohbayashi, both of Hyogo, Japan

[73] Assignee: Mitsubishi Denki Kabushiki Kaisha, Tokyo, Japan

[21] Appl. No.: 787,803

[22] Filed: Jan. 23, 1997

[30] Foreign Application Priority Data

Nov. 5, 1996 [JP] Japan .................. 8-292695

[51] Int. Cl.$^6$ ............................................. G11C 13/00
[52] U.S. Cl. .............................. 365/189.03; 365/52
[58] Field of Search ............................. 365/52, 63

[56] References Cited

U.S. PATENT DOCUMENTS 5,471,425  11/1995  Yumitori et al. ................. 365/52

FOREIGN PATENT DOCUMENTS

| 4344233A1 | 9/1994 | Germany . |
| 2-159583 | 6/1990 | Japan . |
| 5-145031 | 6/1993 | Japan . |

*Primary Examiner*—Terrell W. Fears
*Attorney, Agent, or Firm*—McDermott, Will & Emery

[57] ABSTRACT

A checking circuit is provided which electrically and selectively connects a pad to which an internal circuit is connected, to a reference potential source node, in accordance with a potential of a special pad, when activated. The checking circuit is activated when a burn-in mode detection signal is activated. By detecting a leak current of a pin terminal to which the pad connected to the circuit is electrically connected, the potential of the special pad, that is, set internal function, can be externally identified. Accordingly, a bonding option function of which internal function is set in accordance with the potential of the bonding pad, can be externally detected in a non-destructive manner.

6 Claims, 8 Drawing Sheets

1

SEMICONDUCTOR DEVICE CAPABLE OF EXTERNALLY AND READILY IDENTIFYING SET BONDING OPTIONAL FUNCTION AND METHOD OF IDENTIFYING INTERNAL FUNCTION OF SEMICONDUCTOR DEVICE

BACKGROUND OF THE INVENTION

1. Field of the Invention

The present invention relates to a semiconductor device in which an internal function can be switched in accordance with a potential of a special pad. More specifically, the present invention relates to a semiconductor memory device having a function of Slew Rate Control in which a data output waveform is determined by a set potential of a special pad.

2. Description of the Background Art

Semiconductor devices, especially semiconductor memory devices have various applications. Required performance/function differ dependent on the application where the device is used. For example, word configuration of a semiconductor memory device varies dependent on the use. When word configurations are different, for example in a memory device of ×8 bit configuration and in a memory device of ×16 bit configuration, the number of address bits which are made valid internally, and the number of input/output buffer circuits which are set to the operable state are different. The arrangement of the internal circuits are the same. When the required operation characteristics are the same and only the word configuration is different, efficiency in design is degraded if the memory devices are designed in accordance with respective word configurations, provided that the internal circuit have the common operational characteristics. In such a case, a memory device which implements both word configurations is designed, and the word configuration is switched in accordance with the usage. As a number of memory devices of different types can be implemented by one chip, it becomes possible to manufacture a number of memory devices of different types through the same manufacturing steps, and in additions, efficiency in design can be improved. Such switching of word configuration is realized by setting a potential of a special pad in accordance with the required word configuration.

A structure for changing specification such as the change of word configuration by setting a special pad potential through the use of a bonding wire or a mask interconnections is also used for setting other supported operation modes and performances/functions. In the following description, the term "internal function" encompasses arrangements defined by the specifications such as word configurations, operation modes including EDO (Extended Data Output) and static column mode, and 8 K and 4 K refresh cycles, as well as other arrangements such as setting of speed of change of data when data is output from a memory device as will be described later. More specifically, "internal function" indicates all the functions/arrangements of "bonding option" in which the mode/manner is set in accordance with a special pad potential.

FIG. 15 schematically shows a structure for setting an internal function in accordance with the pad potential. Referring to FIG. 15, a pad PD is electrically connected to a bonding option function circuit BOF through an internal lines INL. Here, "electrically connected" means that there is formed a current path between both elements connected to each other. Functions implemented by the bonding option function circuit BOF is determined in accordance with the potential of pad PD. Pad PD is electrically connected to a frame lead terminal VFd supplying a power supply voltage Vdd, which is a first reference potential, through a bonding wire B1, or electrically connected through a bonding wire B2 to a frame lead terminal VFs transmitting ground voltage Vss or the second reference potential. The function implemented by the bonding option function circuit BOF is determined dependent on whether the pad PD is set to the level of the power supply voltage Vdd or the ground voltage Vss.

In order to protect the semiconductor device from mechanical damage, it is resin-sealed or housed in a package. In that case, it is not possible to externally contact the pad PD. Frame leads VFd and VFs are external pin terminals which allow external contact. Therefore, after the semiconductor device is housed in a package (or after resin-sealed), it is impossible to know externally whether the potential of the pad PD is at the level of the power supply voltage Vdd or the ground voltage Vss. Since the potential set at the pad PD cannot be known externally, it is difficult to determine whether the bonding option function circuit BOF implements the desired internal function or not. In order to determine the internal function implemented by the bonding option function circuit BOF, it is necessary to remove the sealing resin and to expose the pad portion PD. However, in that case, the semiconductor device cannot be used again.

Accordingly, there is a possibility that semiconductor device of which internal function is different from the desired function is delivered.

SUMMARY OF THE INVENTION

An object of the present invention is to provide a semiconductor device in which set potential of a special pad realizing a bonding option function can be readily measured from the outside.

Another object of the present invention is to provide a semiconductor memory device in which whether a slew rate control function for changing signal waveform of an output terminal, at the time of data output, is set correctly as required can be readily identified from the outside.

The semiconductor device in accordance with the present invention includes a normal pad, provided separate from a special pad for applying a potential for determining the internal function and electrically connected to an internal circuit, and checking circuitry receiving a check instruction signal and the potential of the special pad, which is activated when the check instruction signal is activated for electrically connecting the normal pad to the reference potential source node in accordance with the potential of the special pad.

The method of identifying internal function of the semiconductor device in accordance with the present invention in which the internal function is set in accordance with the potential of the special pad, includes the steps of applying a check instruction signal to the semiconductor device, measuring a leak current generated at a pin terminal electrically connected to a predetermined internal circuit of the semiconductor device, and identifying the internal function set in the semiconductor device in accordance with the measured leak current value. The semiconductor device includes circuitry for selectively connecting a predetermined pin terminal to a reference potential source node in the device, in accordance with the potential of the special pad when the check instruction signal is applied.

When the check instruction is activated, the normal pad is electrically connected to the reference potential source node selectively, in accordance with the potential of the special pad. The normal pad is electrically connected to the internal circuit, and hence electrically connected to an external pin terminal. By measuring a leak current generated at the normal pad through the external pin terminal, it is possible to identify whether the normal pad is electrically connected to the reference potential source node. Electrical connection/ disconnection of the normal pad and the reference potential source node corresponds to the potential of the special pad. Therefore, by measuring the leak current value, the potential of the special pad can be identified, and hence the internal function can be identified.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

[First Embodiment]

Figure 1:
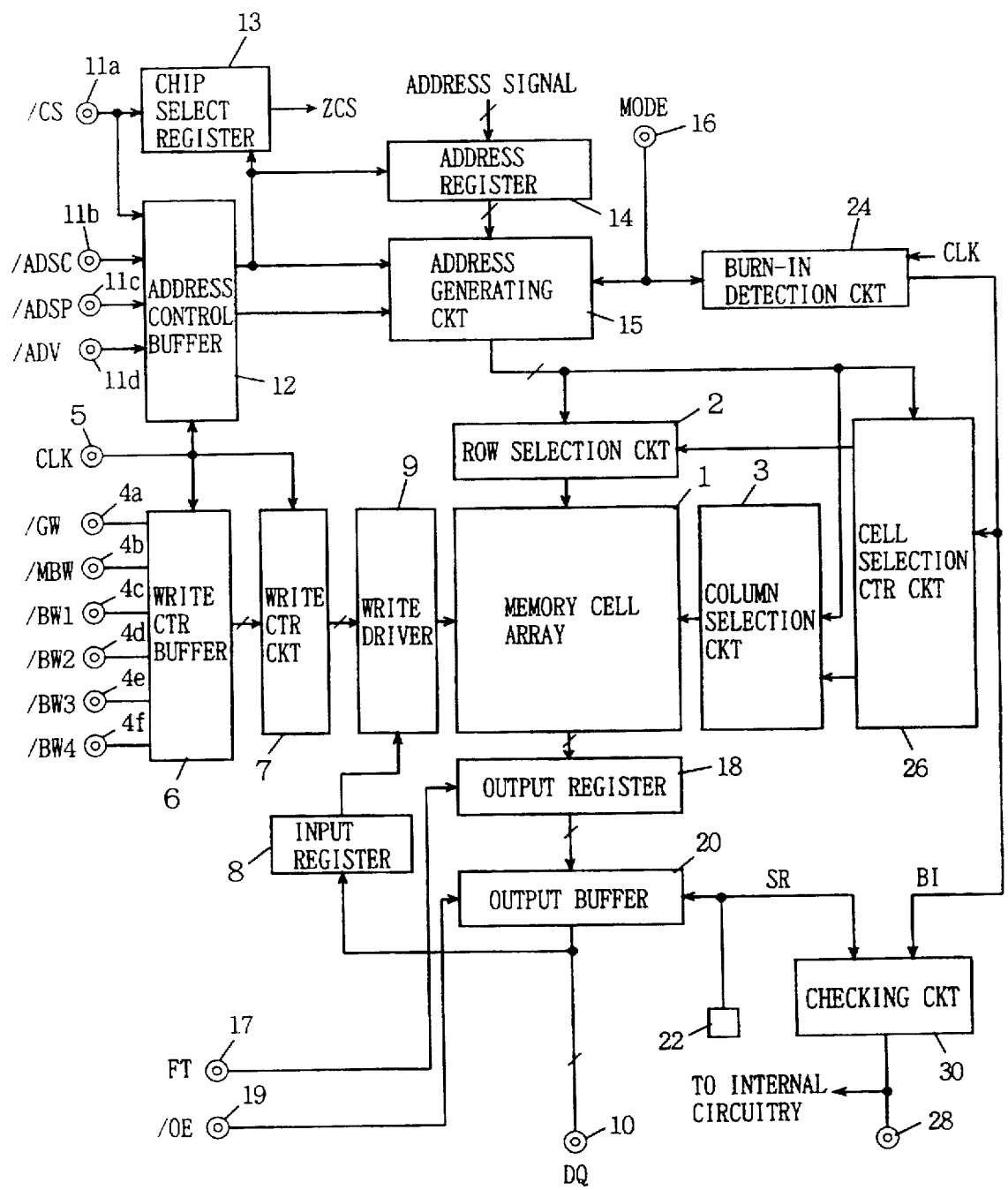
FIG. 1 schematically shows an overall arrangement of a first semiconductor device in accordance with the present invention.

FIG. 1 is a block diagram schematically shows an overall arrangement of the semiconductor device in accordance with the first embodiment of the present invention. In FIG. 1, a clock synchronous type static random access memory in which external control signals and data are incorporated in synchronization with a clock signal CLK, is shown as an example of the semiconductor device.

Referring to FIG. 1, the semiconductor device includes a memory cell array 1 in which static memory cells are arranged in a matrix, a row selecting circuit 2 for driving a corresponding row (word line) of memory cell array 1 in accordance with an applied row address signal to a selected state, and a column selection circuit 3 for selecting a corresponding column (bit line pair) of memory cell array 1 in accordance with an applied column address signal. Row selection circuit 2 includes a row decoder for decoding the applied address signal, a word line driver for driving a word line arranged in the corresponding row to a selected state in accordance with a decode signal from the row decoder.

Column selection circuit 3 includes a column decoder for decoding the applied column address signals for generating a column selection signal, and a column selection gate for selecting a corresponding column (bit line pair) of memory cell array 1 in accordance with the column selection signal from the column decoder and for connecting the selected column to an internal data bus (write/read data bus).

The semiconductor device further includes a write control buffer 6 taking in, in synchronization with a rise of a clock signal CLK applied through a clock input terminal 5, write control signals /Gw, /MBW, /BW1, /BW2, /BW3 and /BW4 applied to input terminals 4a to 4f, for generating an internal write control signal; a write control circuit 7 for controlling writing operation to memory cell array 1 in accordance with the write control signals from write control buffer 6; and a write driver 9 for writing data to a selected memory cell of memory cell array 1 in accordance with the write control signal from write control circuit 7 and internal write data applied from an input register 8.

The signal /GW represents a global write signal, instructing an operation for writing all of the 32 bits of data applied from input register 8 at one time. The signal /MBW represents a master byte write signal and when it is activated, writing of data applied from input register 8 of 32 bits can be controlled by the byte unit. Signals /BW1, /BW2, /BW3 and /BW4 are byte write signals which control data writing of the first, second, third and fourth bytes of the 32 bits of data, respectively. Write control circuit 7 latches the write control signal applied from write control buffer 6 in synchronization with the rise of clock signal CLK, and controls the data writing by the byte unit. Input register 8 takes in 32 bits of data applied through a data input terminal 10 in synchronization with the clock signal CLK and applies the data to write driver 9. In write driver 9, in accordance with the write control signal from write control circuit 7, a driver circuit provided corresponding to the byte of which writing is designated is activated, and write data applied from input register 8 is written to the corresponding memory cell byte.

The semiconductor device further includes an address control buffer 12 taking in signals /CS, /ADSC and /ADSP applied through input terminals 11a, 11b and 11c in synchronization with the rise of the clock signal CLK, decoding the signals /ADSC and ADSP when the signal /CS is active, and for applying an address strobe instruction and address strobe timing in accordance with the result of decoding; a chip select register 13 for latching the signal /CS in response to the address strobe instruction from address control buffer 12; an address register 14 activated when the address strobe instruction from address control buffer 12 is activated, for latching an external address signal; and an address generating circuit 15 for taking in the address from address register 14 and for generating an internal address signal in accordance with the address strobe instruction and address strobe timing instruction from address control buffer 12.

The signal /CS is a chip select signal, which indicates that the semiconductor device is set to a selected state. When an internal chip select signal ZCS from chip select register 13 is activated, internal circuits of the semiconductor device operate, and data writing/reading is performed. The signal /ADSC represents an address status controller signal, which indicates that an address is applied from a memory controller. The signal /ADSP represents an address status processor signal, which indicates that an address strobe instruction is applied from the processor. Address control buffer 12 applies address strobe timing and address strobe instruction when one of the signals /ADSC and /ADSP is active. When the address strobe instruction is applied from address control buffer 12, address generating circuit 15 takes in an internal address signal from address register 14, and applies the taken address signal to row selection circuit 2 and column selection circuit 3.

Address control buffer 12 also takes in an address advance instruction signal /ADV applied to input terminal 11d in synchronization with the rise of clock signal CLK, and applies it to address generating circuit 15. When the address advance instruction signal /ADV is active at the rise of the clock signal CLK, address generating circuit 15 generates an internal address signal by changing the taken address, and applies the generated signal to row selection circuit 2 and column selection circuit 3. When the address generating circuit 15 automatically generates an address signal in accordance with the address advance instruction signal /ADV, the address change sequence is determined by a signal MODE applied to input terminal 16. When the signal MODE is set to the H or L level, the manner of address change is set to an interleave mode or a linear mode. In the linear mode, address generating circuit 15 varies the addresses successively, using the taken address as an initial address. In the interleave mode, address generating circuit 15 generates an internal address signal by alternately inverting least significant 2 bits. Here, an arrangement is assumed in which only four addresses can be generated continuously by address generating circuit 15. The mode in which address generating circuit 15 generates internal address signals successively is referred to as a "burst mode."

The semiconductor device further includes an output register 18 of which data output mode is set in accordance with a fall through instruction signal FT applied from a control terminal 17 and receiving data of the memory cell selected by the column selection circuit 3 of memory cell array 1; and an output buffer 20 which is activated when an output enable signal /OE applied to input terminal 19 is active, for buffering the data applied from output register 18 and for outputting the buffered data to input/output terminal 10.

Output register 18 is set to a through state when the fall through instruction signal FT is active (H level), and simply buffers and transmits the data of the selected memory cell of memory cell array 1. Meanwhile, when the fall through instruction signal FT is set to an inactive state, output register 18 latches data read from memory cell array 1 in synchronization with clock signal CLK and applies it to output buffer 20.

Driving speed of output node (data input/output terminal 10) of output buffer 20 is determined in accordance with the potential level of the special pad 22. Thus a semiconductor memory device having a data output rate in accordance with the process and usage can be implemented.

The semiconductor device further includes a burn-in detection circuit 24 for detecting whether the burn-in mode is designated or not in accordance with the clock signal CLK and mode signal MODE; a cell selection control circuit 26 for changing active period of row selection circuit 2 and column selection circuit 3 when the burn-in detection signal BI from burn-in detection circuit 24 is active; and a check circuit 30 for selectively connecting a terminal 28 connected to an internal circuit to a reference potential source node, in accordance with the set potential SR (slew rate control signal) of the pad 22 and to the burn-in mode detection signal BI.

The cell selection control circuit 26 sets the row selection circuit 2 and column selection circuit 3 to the normally operating state, when the burn-in mode detection signal BI is active. Meanwhile, when the burn-in detection signal BI is inactive, cell selection control circuit 26 detects a change in the address signal from address generating circuit 15, and activates the row selection circuit 2 and column selection circuit 3 only for a prescribed period from the time the change is detected.

In the first embodiment, the internal function defined by the set potential (slew rate control signal SR) of the pad 22 is the output node driving speed of output buffer 20.

Figure 2A:
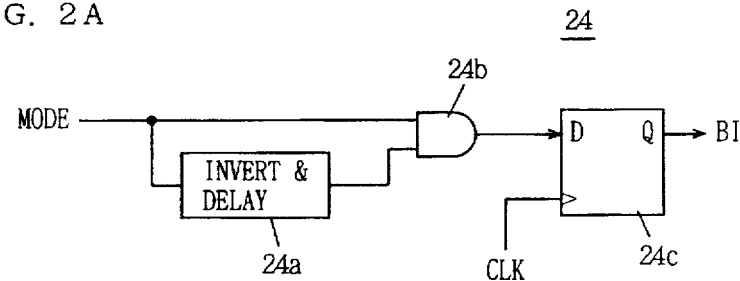
FIG. 2A shows an example of an arrangement of a burn-in detection circuit shown in FIG. 1.
Figure 2B:
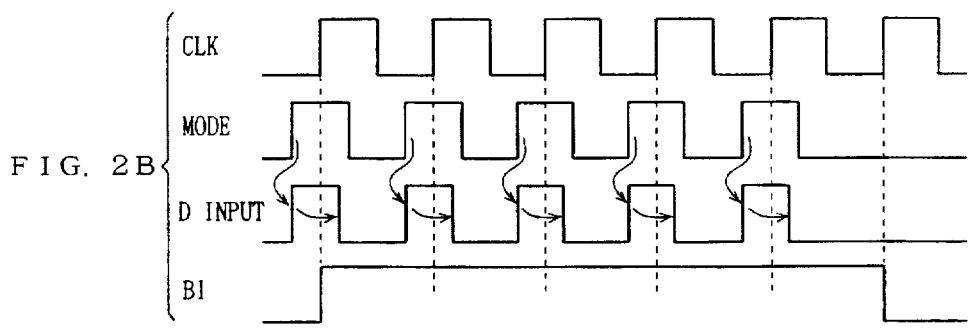
FIG. 2B shows operational waveform thereof.

FIG. 2A shows an example of the arrangement of burn-in detection circuit 24 shown in FIG. 1. Referring to FIG. 2A, the burn-in detection circuit includes an inverting and delaying circuit 24a for providing a delay of a prescribed time period to mode signal MODE and for inverting the logic thereof, an AND circuit 24b receiving the mode signal MODE and an output signal from inverting and delaying circuit 24a, and a D latch 24c for taking in an output signal from AND circuit 24b at a rising edge of clock signal CLK. Burn-in mode detection signal BI is output from an output Q of D latch 24c. The operation will be described with reference to the waveforms of FIG. 2B.

The mode signal MODE repeatedly assumes the H and L levels in the same period as the clock signal CLK. In this case, the mode signal MODE is set to the H level at the rise of clock signal CLK. The inverting and delaying circuit 24a inverts the logic of the mode signal MODE, and delays the signal by a prescribed time period. Therefore, from AND circuit 24b, a signal is applied to the D input of D type flipflop 24c, which signal is set to and kept at the H level for the delay time of the inverting and delaying circuit 24a in response to the rise of mode signal MODE. The output signal from AND circuit 24b is taken in by the D type flip-flop 24c at a rising edge of clock signal CLK. Accordingly, when the output signal from AND circuit 24b is at the H level, that is, in the period during which the operation of raising the mode signal MODE from the L level to the H level is repeated, the burn-in mode detection signal BI from D type flip-flop 24c is set at the H level. When the mode signal MODE is fixed at the L level, the output signal from AND circuit 24b is also fixed at the L level. Therefore, in this state, the output signal from AND circuit 24b is at the L level at the rise of the clock signal CLK, the burn-in mode detection signal BI from D type flip-flop 24c is set to the L level, and hence termination of burn-in mode is instructed.

When the application for the semiconductor device is determined, the address sequence is set fixedly (as the burst address sequence is set by the type of the processor to be applied). Accordingly, by detecting the burn-in mode with the operation mode in which the mode signal MODE is toggled between the H and L levels, erroneous setting of the burn-in mode by the user can be prevented. The burn-in mode refers to the final test before delivery of the product, and the user never utilizes such a mode. By setting the burn-in mode by an operation mode which will never be used by the user, erroneous setting of the burn-in mode by the user during actual use of the semiconductor device can be prevented.

The arrangement of the burn-in detection circuit 20 shown in FIG. 2A is only an example. Any arrangement may be used provided that the burn-in mode is set by a combination of signal states not used in normal operation by the user.

[Arrangement of Cell Selection Control Circuit]

Figure 3A:
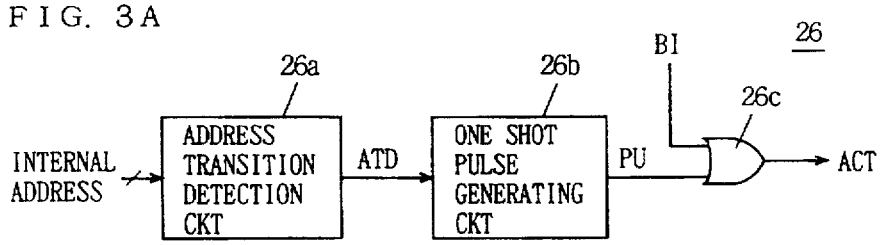
FIG. 3A shows an example of a structure of a cell selection control circuit shown in FIG. 1.

FIG. 3A schematically shows an example of the arrangement of cell selection control circuit 26 shown in FIG. 1. Referring to FIG. 3, cell selection control circuit 26 includes an address transition detecting circuit 26a detecting a transition of an internal address signal applied from address signal generating circuit 15, a one shot pulse generating circuit 26b for generating a one shot pulse signal PU having a prescribed time width in response to the address transition detection signal ATD from address transition detection circuit 26a, and an OR circuit 26c receiving the burn-in mode detection signal BI and the one shot pulse PU from one shot pulse generating circuit 26b.

Figure 3B:
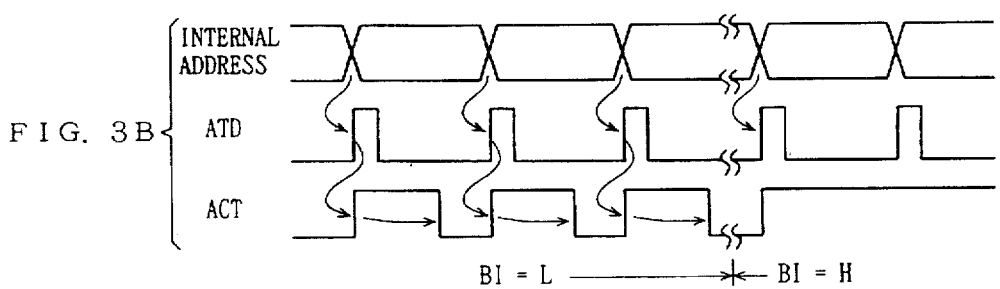
FIG. 3B shows operational waveforms thereof.

From OR circuit 26c, a signal ACT which activates row selection circuit 2 and column selection circuit 3 shown in FIG. 1 is generated. When the signal ACT is active, row selection circuit 2 and column selection circuit 3 are set to operable state. FIG. 3B is a diagram of signal waveforms showing the operation of cell selection control circuit 26 shown in FIG. 3. The operation of cell selection control circuit 26 shown in FIG. 3A will be described with reference to the waveforms of FIG. 3B.

When an internal address changes, address transition detection circuit 26a detects the change and generates an address transition detection signal ATD which is one shot pulse signal having a prescribed time width. One shot pulse generating circuit 26b generates a one shot pulse signal in response to the rise of address transition detection signal ATD. When the burn-in mode detection signal BI is at the L level, the pulse signal PU from one shot pulse signal generating circuit 26b is applied as the activating signal ACT, from OR circuit 26c. Therefore, when the burn-in mode detection signal BI is at an inactive state of L level, that is, in the normal operation mode, the row selection circuit 2 and column selection circuit 3 are set to and kept at the active state only for a prescribed time period, regardless of the cycle period of the clock signal CLK in accordance with the transition of the address.

When the burn-in mode detection signal BI is set to the H level, the pulse signal PU is generated in accordance with the address transition detection signal ATD. However, regardless of the pulse signal PU, the activating signal ATC is fixed at the active state of H level. In the burn-in mode, a voltage stress is applied to each of the circuit components. Therefore, when the clock signal has long period, the column selection circuit 3 and row selection circuit 2 are operated for the long time period of the clock period, so that sufficient voltage stress is applied to each circuit.

In the structure of cell selection control circuit 26 shown in FIG. 3A, address transition detection circuit 26a may be adapted to generate the address transition detection signal ATD only when the internal chip selection signal ZCS is active. The address change detection circuit can be readily implemented by providing a delay circuit for each bit of the address signal by using coincidence detection circuit receiving an output from the delay circuit and the corresponding address signal bit.

[Arrangement of Output Buffer]

Figure 4:
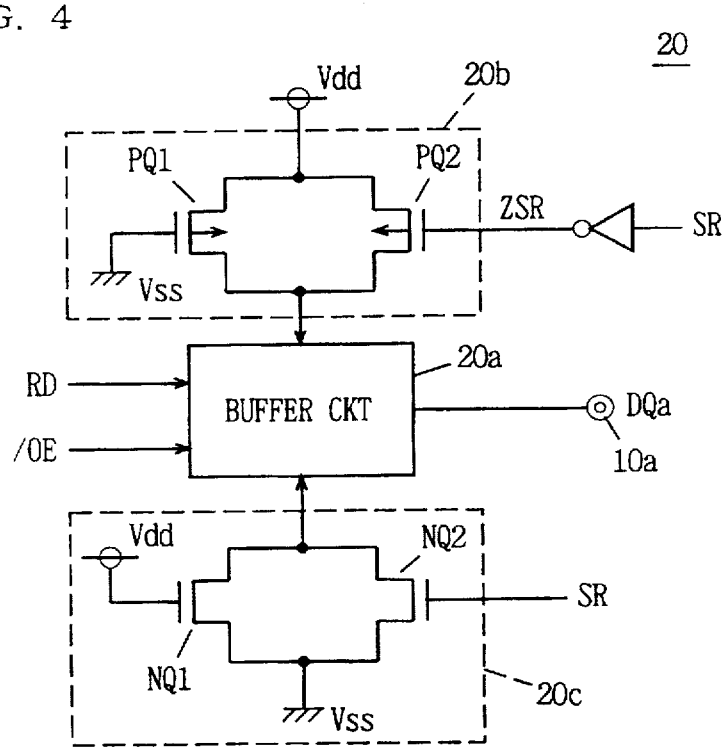
FIG. 4 shows an example of an arrangement of an output buffer circuit shown in FIG. 1.

FIG. 4 schematically shows the arrangement of output buffer 20 shown in FIG. 1. In FIG. 4, arrangement of an output buffer circuit provided corresponding to 1 bit of data input/output terminal 10a is shown. In FIG. 4, output buffer 20 includes a buffer circuit 20a which is activated when output enable signal /OE is active, for buffering internal read data RD and transmitting it to data input/output terminal 10a, and drivability adjustment circuits 20b and 20c for adjusting amount of supply current to buffer circuit 20a in accordance with the set potential (represented by the signal SR) of pad 22 shown in FIG. 1.

Buffer circuit 20a drives the data input/output terminal 10a to a potential level in accordance with internal read data RD, in accordance with the amount of current supplied from drivability adjustment circuit 20b and 20c. Drivability adjustment circuit 20b includes a p channel MOS transistor PQ1 connected between an internal power supply node and one operational power supply node of buffer circuit 20a and receiving at its gate the ground voltage Vss, and a p channel MOS transistor PQ2 provided parallel to the MOS transistor PQ1 and receiving at its gate a signal ZSR which is prepared by inverting the logic of the set potential at pad 22. The current supplying capability of MOS transistor PQ2 is made greater than that of MOS transistor PQ1. MOS transistor PQ1 is normally set at a conductive state, and supplies current from the power supply node to one operational power supply node of buffer circuit 20a with the current supplying capability provided by the ratio of gate width to gate length.

Drivability adjustment circuit 20c includes an n channel MOS transistor NQ1 connected between the other power supply node of buffer circuit 20a and a ground node and receiving at its gate the power supply voltage Vdd, and an n channel MOS transistor NQ2 connected parallel to MOS transistor NQ1 and receiving at its gate the set potential (signal SR) of pad 22 (see FIG. 1). The current supplying capability of MOS transistor NQ2 is set greater than that of MOS transistor NQ1. MOS transistor NQ1 receives at its gate the power supply voltage Vdd, and it is kept normally conductive to sink discharge current from buffer circuit 20a.

Figure 5:
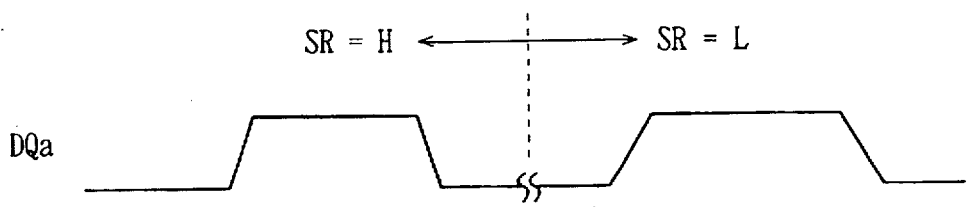
FIG. 5 is an illustration showing slew rate control function of the output buffer circuit.

When pad 22 is fixed at the level of the power supply voltage Vdd, the signal SR attains to the H level. In this state, p channel MOS transistor PQ2 in drivability adjustment circuit 20b and n channel MOS transistor NQ2 in drivability adjustment circuit 20c both turn on. Therefore, drivability adjustment circuit 20b supplies current from the power supply node to one operational power supply node of buffer circuit 20a through MOS transistors PQ1 and PQ2, while drivability adjustment circuit 20c discharges current from the other operational power supply node of the buffer circuit 20a to the ground node through MOS transistors NQ1 and NQ2. Therefore, as shown in FIG. 5, drivability of data input/output terminal 10a of buffer circuit 20a is increased, and data DQa at data input/output terminal 10a changes at high speed.

Meanwhile, when pad 22 is set to the level of the ground voltage, the signal SR attains to the L level, and MOS transistors PQ2 and NQ2 are both turned off. In this state, drivability adjustment circuit 20b supplies current to buffer circuit 20a only through MOS transistor PQ1, and drivability adjustment circuit 20c discharges the discharge current from buffer circuit 22a to the ground node through MOS transistor NQ1. Therefore, in this state, current drivability of buffer circuit 20a becomes smaller, and data DQa on data input/output terminal 10a changes relatively moderately as shown in FIG. 5.

Therefore, by setting the potential of pad 22 to the level of the power supply voltage Vdd or the ground voltage Vss, the speed of operation of output buffer 20 can be set (when output load is approximately the same).

By fixing the level of the potential pad 22 (signal SR), it is possible to implement a chip outputting data at high speed and a chip outputting data at a relatively low speed by one chip. Especially in a clock synchronous type semiconductor device, data is sampled in synchronization with the clock signals. Therefore, at the rising edge of the clock signal, data should surely be established. Therefore, the set up time and the hold time of read data with respect to the clock signal must be ensured. By selectively setting the potential of pad 22, the output node driving speed and set up time can be set in accordance with the operational environment (clock frequency) used.

Figure 6:
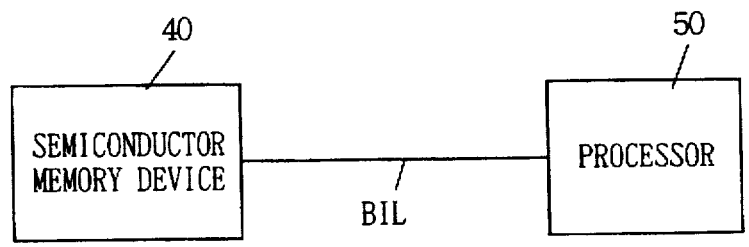
FIG. 6 is an illustration for a waveform utilizing the slew rate function.

When a semiconductor memory device 40 and processor 50 are connected to each other by a line BIL on a printed circuit board as shown in FIG. 6, the resistance and capacitance of on-board line BIL differ dependent on the arrangement of semiconductor memory device 40 and processor 50 on the board. Therefore, when the load of the line BIL on the board is relatively small, drivability of output buffer is made small, and when the load of line BIL on the board is large, drivability of the output buffer is increased. In that case, current supplying capability (output node drivability) of output buffer 20 in accordance with the load of the line BIL on the board can be attained. Therefore, in an environment where the device operates with the same system clock frequency, by adjusting drivability of the output buffer in accordance with the load of the on-board line BIL, accurate data can surely be generated without generation of ringing or the like, and hence a semiconductor memory device matching the system performance can be implemented.

[Arrangement 1 of Checking Circuit]

Figure 7:
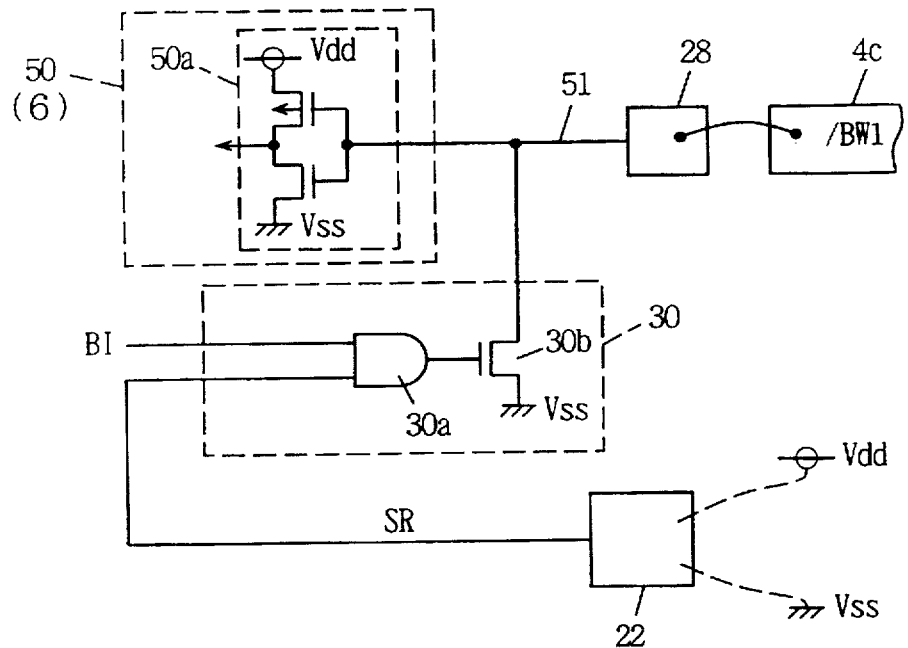
FIG. 7 schematically shows a first arrangement of a checking circuit shown in FIG. 1.

FIG. 7 shows an arrangement of the checking circuit shown in FIG. 1. In FIG. 7, a pad connected to a terminal 4c receiving a byte write signal /BW1 is shown as an example of the normal pad 28 electrically connected to the internal circuit. Therefore, internal circuit 50 electrically connected to pad 28 through internal line 51 corresponds to the write control buffer 6 shown in FIG. 1. Internal circuit 50 includes a CMOS inverter 50a including a p channel MOS transistor and an n channel MOS transistor.

Checking circuit 30 includes 2-input AND circuit 30a receiving burn-in mode detection signal BI and the potential on pad 22 (signal SR), and an n channel MOS transistor 30b connected between internal line 51 and ground node Vss and receiving at its gate an output signal from AND circuit 30a. Pad 22 is set to the level of the power supply voltage Vdd or the ground voltage Vss by a bonding wire represented by a dotted line in FIG. 7. The operation will be described.

In the normal operation node, the burn-in mode detection signal BI is at the L level, and the output signal from AND circuit 30a is fixed at the L level. Therefore, in this state, MOS transistor 30b is off, and internal circuit 50 (write control buffer 6) operates in accordance with the signal applied through internal line 51 and pad 28 of pin terminal 4c.

When the burn-in mode is designated, burn-in mode detection signal BI attains to the H level, and AND circuit 30a operates as a buffer circuit. When pad 22 is set to the level of the power supply voltage Vdd, the signal SR is at the H level, the output signal from AND circuit 30a attains to the H level, and MOS transistor 30b turns on. Meanwhile, when pad 22 is set to the level of the ground voltage Vss, the signal SR attains to the L level, the output signal from AND circuit 30a attains to the L level, and MOS transistor 30b turns off.

In an input initial stage buffer 50a of internal circuit 50, an MOS transistor, which is a component thereof, has its gate connected to internal line 51. Therefore, there is not a current path from internal line 51 through input initial stage buffer 50a. Therefore, by applying a signal at the H level to pin terminal 4c and generating a path through which current flows selectively from pad 28 through internal line 51 to ground node Vss, it is possible to determine whether the MOS transistor 30b is on or off by an external tester, measuring presence/absence of the leak current at pin terminal 4c, that is, it is possible to identify the voltage level set at pad 22. That the set potential level of pad 22 can be identified means it is possible to identify whether the slew rate of output buffer is reduced or not.

When the burn-in mode is set, the semiconductor device is set to the initial state, and byte write signal /BW1 is at the H level. Therefore, by using a normal tester, internal function (output node driving speed) set in the semiconductor device can be identified in the burn-in mode.

Figure 8:
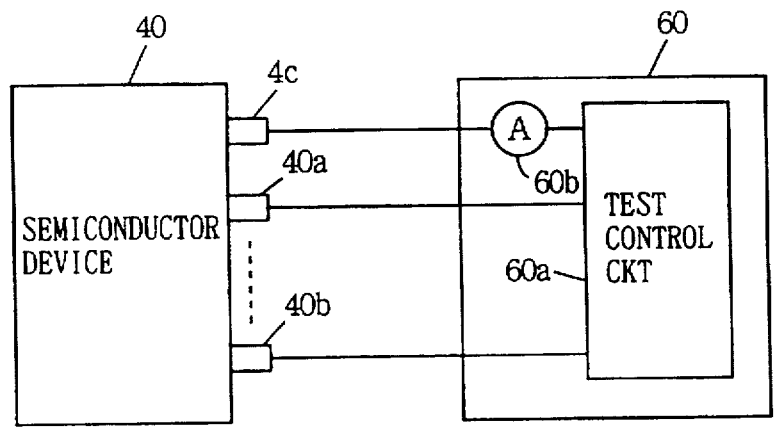
FIG. 8 shows a test environment of the semiconductor device when the checking circuit shown in FIG. 7 is used.

FIG. 8 schematically shows the arrangement of test environment for identifying internal function of the semiconductor device. In FIG. 8, signals (voltages) are applied from a tester 60 in a prescribed sequence respectively to pin terminals 40a, 40b and 4c of semiconductor device 40. Tester 60 includes a test control circuit 60a storing signal waveforms applied at the time of testing the semiconductor device 40 and for applying signals (voltages) in a prescribed sequence, and setting of the burn-in mode is done by test control circuit 60a. At this time, test control circuit 60a outputs a signal at the H level to pin terminal 4c. By measuring the amount of current flowing though ampere meter 60b, it is possible to measure whether there is a leak current or not at the pin terminal 4c of semiconductor device 40, and hence it is possible to identify whether the slew rate of semiconductor device 40 is adjusted or not.

At pin terminal 4c, there is a current leak which is tolerable in the standby state. MOS transistor 30b is only to supply a current larger than the tolerable leak current value, and hence not so large a current drivability is required of MOS transistor 30b. Generally, in the burn-in mode, a plurality of semiconductor devices are tested simultaneously. Therefore, when semiconductor devices manufactured through the same manufacturing steps are to be burn-in tested simultaneously and the leak current in each checking circuit 30 is small, leak currents at pin terminals of the semiconductor devices which are burn-in tested simultaneously are added, so that the current value becomes high. Accordingly, even when current drivability of MOS transistor 30b in checking circuit 30 of each semiconductor device 40 is small, it is possible to identify whether the normal pad 28 is electrically connected to the ground node or not by checking circuit 30 in semiconductor device 40, sufficiently by the ampere meter 60b.

[Checking Circuit 2]

Figure 9:
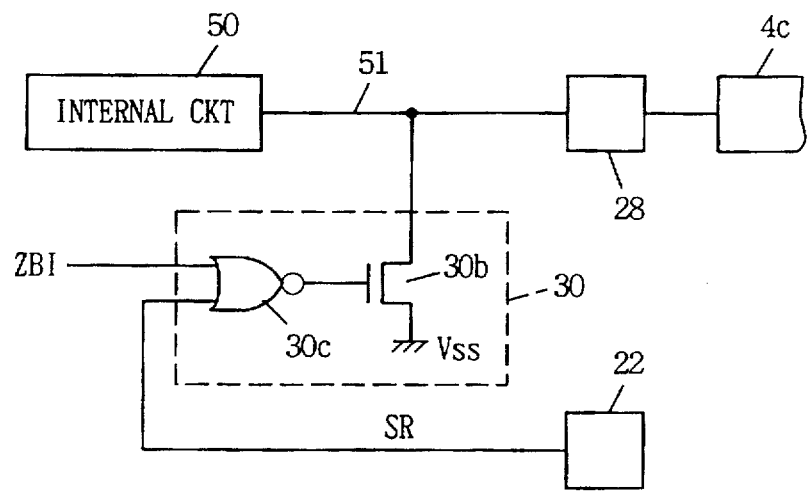
FIG. 9 schematically shows a second arrangement of a checking circuit in accordance with a present invention.

FIG. 9 shows an arrangement of a modification of the checking circuit. The checking circuit shown in FIG. 9 includes an NOR circuit 30c receiving the burn-in mode detection signal ZBI and the potential on pad 22 (signal SR), and an n channel MOS transistor 30b for electrically connecting internal line 51 to the ground node when the output signal NOR circuit 30c is active. Burn-in mode detection signal ZBI is set to the L level when the burn-in mode is set, and in normal operation, it is set to the H level.. Except these points, the arrangement of FIG. 9 is the same as that of FIG. 7. Corresponding portions are denoted by the same reference characters and description thereof is not repeated.

In the arrangement of the checking circuit shown in FIG. 9, in the normal operation mode, burn-in mode detection signal ZBI is at the H level, the output signal from NOR circuit 30c attains to the L level, and internal line 51 is electrically disconnected from the ground node. In this state, internal circuit 50 outputs a signal in accordance with the signal applied to pad 28. When the burn-in mode is set, burn-in mode detection signal ZBI attains to the L level, and NOR circuit 30c operates as an inverter. Therefore, when the potential of pad 22 is at the level of the power supply voltage Vdd, the signal SR attains to the H level, and the output signal from NOR circuit 30c attains to the L level. Meanwhile, when pad 22 is set to the level of the ground voltage Vss, the signal SR attains to the L level, the output signal from NOR circuit 30c attains to the H level.

Therefore, MOS transistor 30b is set to the on state or to the off state in accordance with the potential level of the signal SR. Consequently, a current path is formed at the pad 28 electrically connected to external pin terminal 4c. It is possible to apply an H level signal to pin terminal 4c, to measure the leak current at pin terminal 4c and to identify the set potential level of pad 22 in accordance with the magnitude (presence/absence) of the leak current. More specifically, when pad 22 is set to the level of the power supply voltage Vdd, there is not a leak current (or quite small leak current: only the leak current in internal circuit 50) at pin terminal 4c, and when pad 22 is set to the level of the ground voltage Vss, a large leak current flows through pin terminal 4c.

[Checking Circuit 3]

Figure 12:
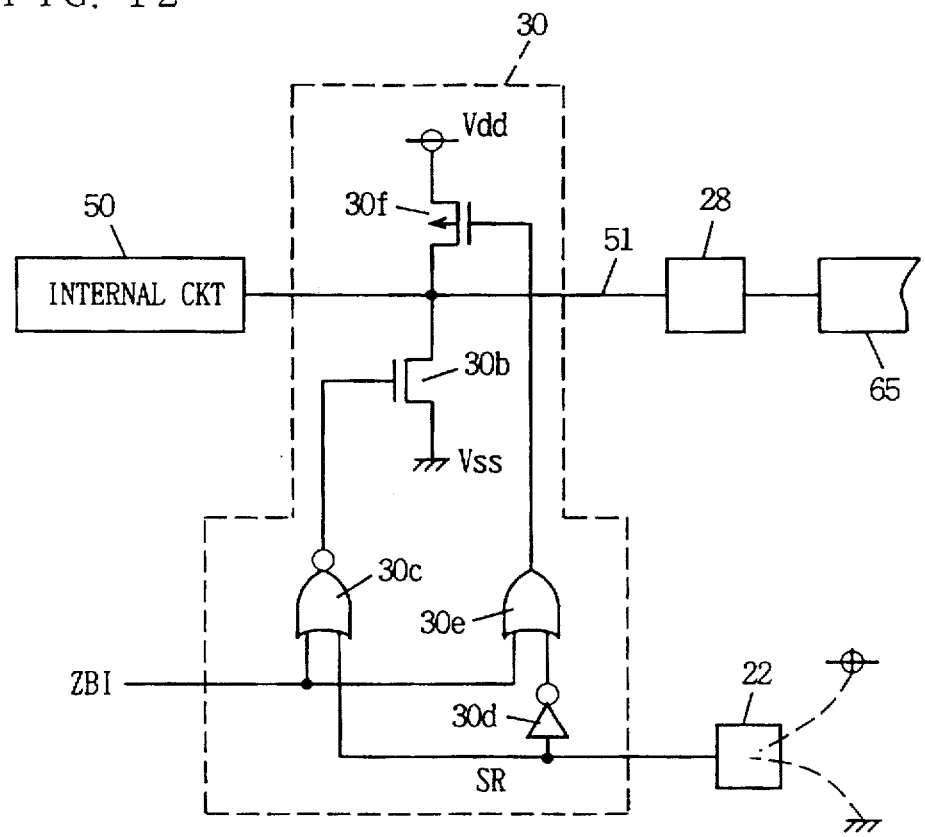
FIG. 12 schematically shows a fourth arrangement of the checking circuit in accordance with the present invention.
Figure 10:
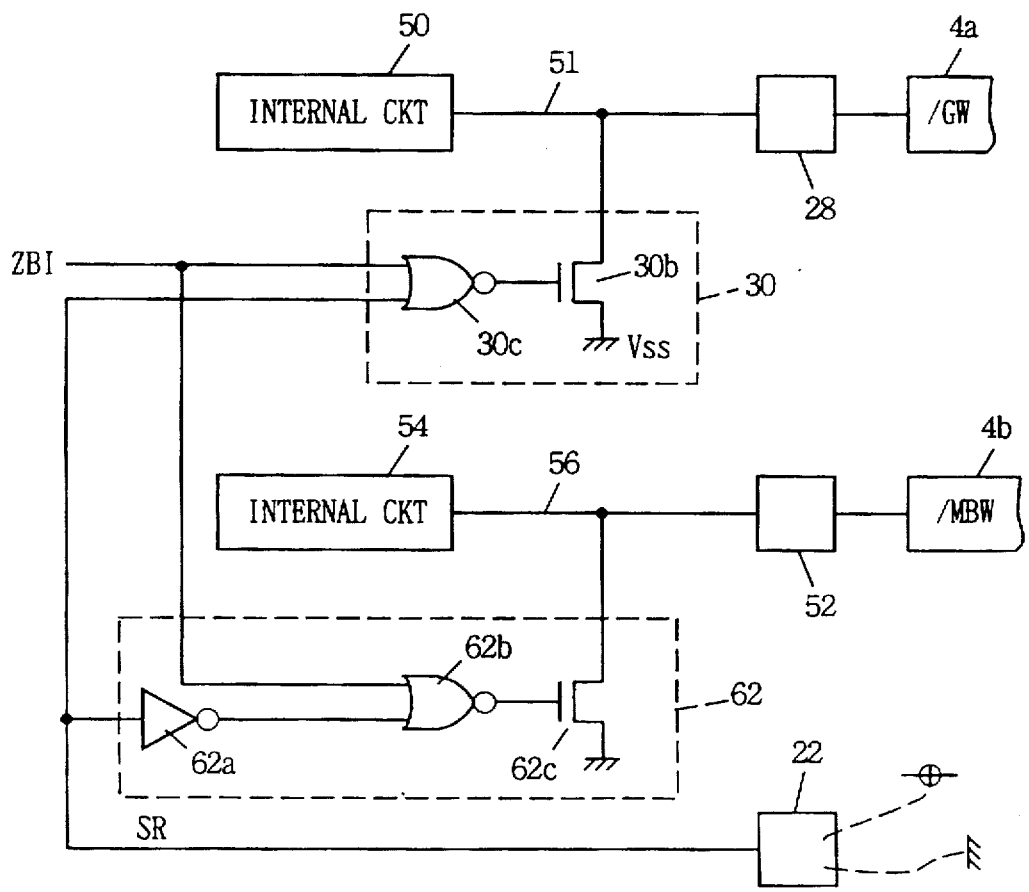
FIG. 10 schematically shows a third arrangement of the checking circuit in accordance with the present invention.

FIG. 10 shows a third arrangement of the checking circuit in accordance with the present invention. Referring to FIG. 12, similar to the structure shown in FIG. 9, for internal line 51, there is provided checking circuit 30 for electrically connecting internal line 51 to the ground node in accordance with the potential of pad 22 (signal SR) and burn-in mode detection signal ZBI. Internal line 51 electrically connects the internal circuit 50 to the pad 28 which is connected to external pin terminal 4a. To pin terminal 4a, global write signal /GW shown in FIG. 1 is applied. Checking circuit 30 includes an NOR circuit 30c receiving burn-in mode detection signal ZBI and the potential of pad 22 (signal SR), and an n channel MOS transistor 30b for electrically connecting internal line 51 to the ground node in accordance with an output signal from NOR circuit 30c.

In the arrangement shown in FIG. 10, further a second checking circuit 62 is provided for internal line 56 which electrically connects an internal circuit 54 provided separate from internal circuit 50 to another pad 52. Pad 52 is electrically connected to a pin terminal 4b receiving the master byte write signal /MBW.

Checking circuit 62 includes an inverter 62a receiving the potential on pad 22 (signal SR), an NOR circuit 62b receiving an output signal from inverter 62a and burn-in mode detection signal ZBI, and an n channel MOS transistor 62c for electrically connecting internal line 56 to the ground node in accordance with an output signal from NOR circuit 62b. The operation will be described.

In the normal operation mode, burn-in mode detection signal ZBI is at the H level, NOR circuits 30c and 62b both output L level signals, and MOS transistors 30b and 62c are both off. Therefore, internal lines 51 and 56 are electrically disconnected from the ground node, and internal circuits 50 and 54 operate in accordance with the signals applied from pin terminals 4a and 4b through pads 28 and 52, respectively.

In the burn-in mode, burn-in mode detection signal ZBI is at the L level, and NOR circuits 30c and 62b operate as inverters. The signal SR (potential on pad 22) is applied to NOR circuit 30c, and signal SR is applied through inverter 62a to NOR circuit 62b. Therefore, checking circuits 30 and 62 operate complementarily to each other in the burn-in mode. More specifically, when pad 22 is set to the level of the power supply voltage Vdd and a signal SR is at the H level, MOS transistor 62c of checking circuit 62 turns on, and internal line 56 is electrically connected to the ground node. Meanwhile, MOS transistor 30b of checking circuit 30 is off, and internal line 51 is electrically disconnected from the ground node. Therefore, when the pad 22 is set at the level of the power supply voltage Vdd, leak current flows to pin terminal 4b, and leak current does not flow (or very small leak current flows) to pin terminal 4a.

Meanwhile, when pad 22 is set to the level of the ground voltage Vss, the signal SR is at the L level, and MOS transistor 30b of checking circuit 30 turns on, while MOS transistor 62c of checking circuit 62 turns off. Therefore, in this state, internal line 51 is electrically connected to the ground node, and internal line 56 is electrically disconnected from the ground node. Therefore, leak current flows to pin terminal 4a, and leak current is not generated at all (or only a very small leak current is generated) at pin terminal 4b. Now, when pad potential is detected, a signal at the H level is applied to pin terminals 4a and 4b. Therefore, by identifying to which of the pin terminals 4a and 4b the leak current flows, the set potential of pad 22 can be identified.

Figure 11:
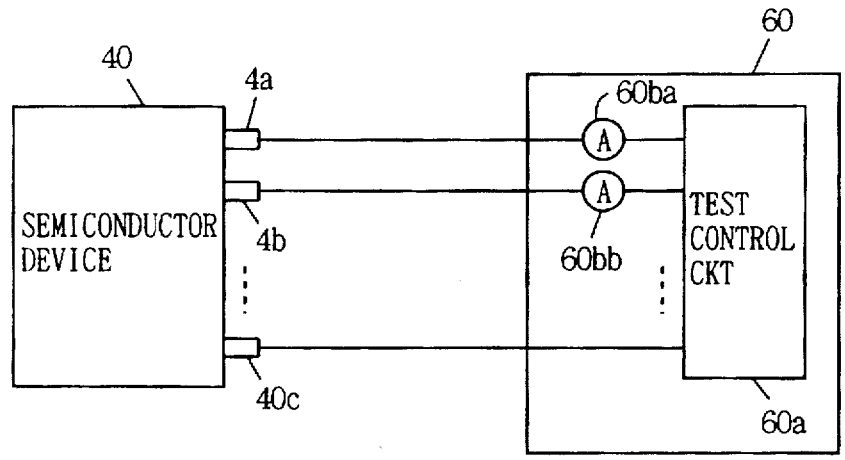
FIG. 11 shows a test environment when the checking circuit shown in FIG. 10 is used.

FIG. 11 schematically shows an arrangement for testing a semiconductor device having the checking circuit shown in FIG. 10. Referring to FIG. 11, signals (voltages) in accordance with a prescribed sequence are applied from tester 60 to pin terminals 4a, 4b, . . . , 40c of semiconductor device 40. Tester 60 includes a test control circuit 60a for applying signals in the prescribed sequence to respective pin terminals 4a, 4b, . . . , 40c of semiconductor device 40, and ampere meters 60ba and 60bb provide between pin terminals 4a and 4b and outputs of test control circuit 60a. To the pin terminals 4a and 4b, signals from test control circuit 60a are applied through ampere meters 60ba and 60bb. When the burn-in mode is set, flowing current is measured by ampere meters 60ba and 6Obb, and to which of the pin terminals a leak current larger than the tolerable leak current flows is identified, so that the potential of pad 22 of the semiconductor device 40, that is, internal function (slew rate adjustment) of semiconductor device 40 is identified.

Even when the checking circuit shown in FIG. 10 is used, any extra pad or pin terminal is required. Simply by adding ampere meters to the conventional tester, it becomes possible to identify the internal function (slew rate adjustment function) set in the semiconductor device 40.

[Checking Circuit 4]

FIG. 12 shows a fourth arrangement of the checking circuit. Referring to FIG. 12, checking circuit 30 connects internal line 51 electrically connecting internal circuit 50 through pad 28 to an external pin terminal 65, either to the power supply node or the ground node selectively in accordance with the set potential of pad 22 when burn-in mode is designated. More specifically, checking circuit 30 includes an NOR circuit 30c receiving burn-in mode detection signal ZBI and the potential on pad 22 (signal SR), an n channel MOS transistor 30b for electrically and selectively connecting internal line 51 to the ground node in accordance with the output signal from NOR circuit 30c, an inverter 30b for inverting a logic of the potential on pad 22 (signal SR), an OR circuit 30e receiving burn-in mode detection signal ZBI and an output signal from inverter 30e and a p channel MOS transistor 30f for electrically and selectively connecting internal line 51 to the power supply node in accordance with an output signal from OR circuit 30e. The operation will be described in the following.

In the normal operation mode, burn-in mode detection signal ZBI is at the H level, the output signal from NOR circuit 30c is at the L level and the output signal from OR circuit 30e attains to the H level, and MOS transistors 30b and 30f are both off. Internal circuit 50 operates in accordance with a signal applied from pin terminal 65.

When the burn-in mode is designated, burn-in mode detection signal ZBI is set to the L level, NOR circuit 30c operates as an inverter, and OR circuit 30e operates as a buffer circuit. When pad 22 is set to the level of the power supply voltage Vdd, the output signal from NOR circuit 30c attains to the L level, and the output signal from OR circuit 30e attains to the L level. Therefore, MOS transistor 30b turns off, MOS transistor 30f turns on, and internal line 51 is electrically connected to the power supply node.

Meanwhile, when pad 22 is set to the level of the ground voltage Vss, the output signal from NOR circuit 30c attains to the H level, the output signal from OR circuit 30e attains to the H level, MOS transistor 30f turns off, and MOS transistor 30b turns on. In this state, internal line 51 is electrically connected to the ground node. In the checking circuit 30 shown in FIG. 12, the following method is possible as a method of identifying the potential set at pad 22.

In one method, first an H level signal is applied to pin terminal 65, and presence/absence of the leak current is detected. When MOS transistor 30f is on, internal line 51 is electrically connected to the power supply node, and hence leak current at pin terminal 65 is not higher than the tolerable value. When MOS transistor 30b is on, a large leak current flows. Therefore, set potential of pad 22 can be identified. At this time, a step of applying an L level signal to pin terminal 65 and detecting presence/absence of leak current may be added. When MOS transistor 30f is on, current is discharged from checking circuit 30 to terminal 65. When MOS transistor 30b is on, the leak current is not higher than the tolerable value. Therefore, when the applied voltage to pin terminal is at the L level, whether current is discharged from pin terminal 65 or not is identified. Though two steps are required, the set potential of pad 22 can be surely identified.

As another method, a signal at a voltage intermediate between the power supply voltage Vdd and ground voltage Vss is applied to pin terminal 65. In this state, magnitude and direction of the leak current flowing through pin terminal 65 are detected. When MOS transistor 30f is on, current is discharged from setting circuit 30 to pin terminal 65. Meanwhile, if MOS transistor 30b is on, leak current flows from pin terminal 65 to setting circuit 30. Therefore, by identifying the magnitude and the direction of the leak current, it is possible to identify the set potential of pad 22, and hence the set internal function (slew rate adjustment function).

The test environment used in this case is the same as that shown in FIG. 1.

In the above described embodiment, a signal input circuit is used as the internal circuit. The input circuit has its input initial stage constituted by a CMOS inverter, and there is not a current path from internal line 51 through the input initial stage of the internal circuits, and therefore, whether or not there is a current path formed in accordance with the set potential of the pad can surely be identified. The signal output circuit is not used, in order to suppress the formation of extra current path at the final output stage of the signal output circuit as the checking circuit operates in the burn-in mode, and to prevent undesirable influence of the leak current generated in the current path of the final output stage to identification of the pad potential. However, when not the burn-in mode detection signal but another signal (dedicated signal) is used as the check instruction signal, or when the output buffer is set to the output high impedance state while the check instruction signal is active, a current path may be selectively formed for the pad connected to the output buffer.

[Other application]

Figure 13:
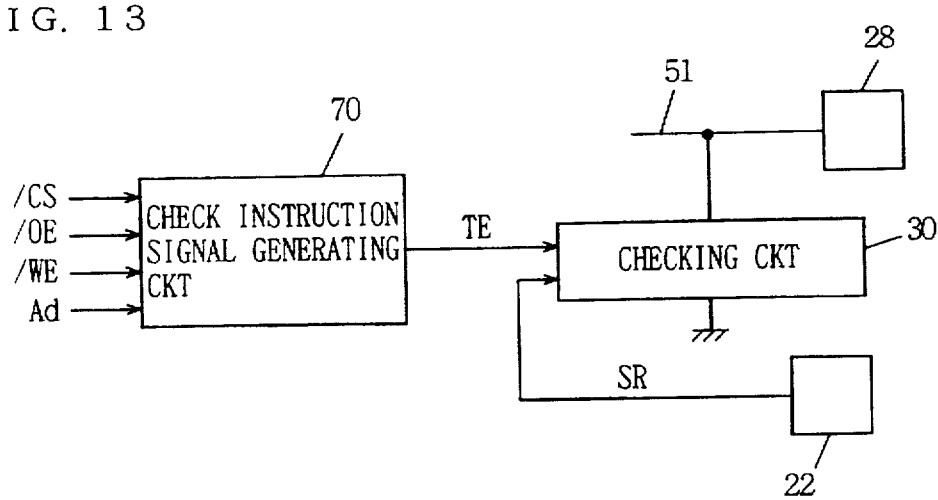
FIG. 13 schematically shows another arrangement of the check instruction signal generating circuit for activating the checking circuit.

FIG. 13 schematically shows an arrangement of a main portion of the modification of the semiconductor device in accordance with the present invention. The arrangement shown in FIG. 13 includes a check instruction signal generating circuit 70 receiving external signals, chip select signal /CS, output enable signal /OE, write enable signal /WE and a specific address signal bit Ad (or address signal bits), for activating a check instruction signal TE when these signals are set to prescribed states, and a checking circuit 30 which is activated when the check instruction signal TE from check instruction signal generating circuit 70 is active for electrically connecting the internal line 51 and pad 28 to the ground node (reference potential source node) in accordance with the potential on pad 22 (signal SR).

Check instruction signal generating circuit 70 activates the check instruction signal TE when external signals /CS, /OE, /WE and Ad are set to a state which is not usually used by the user. As for such combination of the signal state, for example, chip select signal /CS is set to the H level, signals /OE and /WE are both set to the L level and a plurality of address signal bits Ad are set to a specific logic level.

In the arrangement shown in FIG. 13, checking circuit 30 is activated/inactivated by using a dedicated signal TE for check mode instruction. Therefore, it is possible to provide checking circuit 30 at a pad 28 near pad 22, and to arrange the check instruction signal generating circuit 70 near the checking circuit 30. Therefore, layout of the checking circuitry is facilitated.

Further, the semiconductor device is not limited to a clock synchronous type static random access memory operating in synchronization with a clock signal, and it may be a common static random access memory. It may be a dynamic random access memory (DRAM) or any other memory (for example, a flash memory).

[Other application 2]

Figure 14:
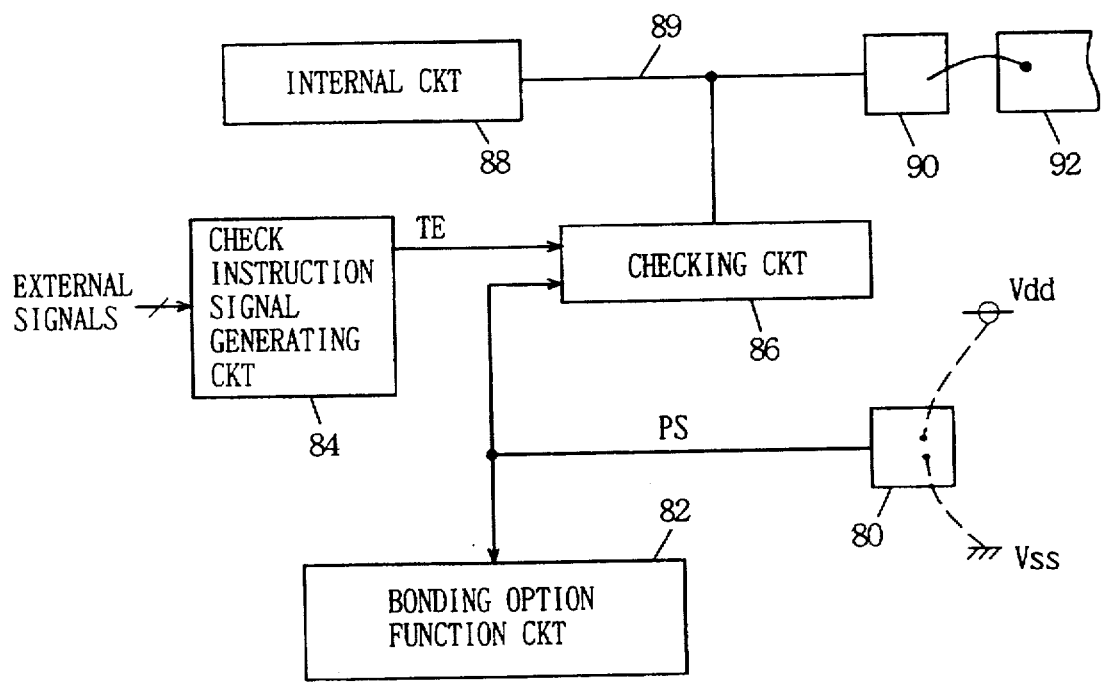
FIG. 14 schematically shows an arrangement of a main portion of a second semiconductor device in accordance with the present invention.
Figure 15:
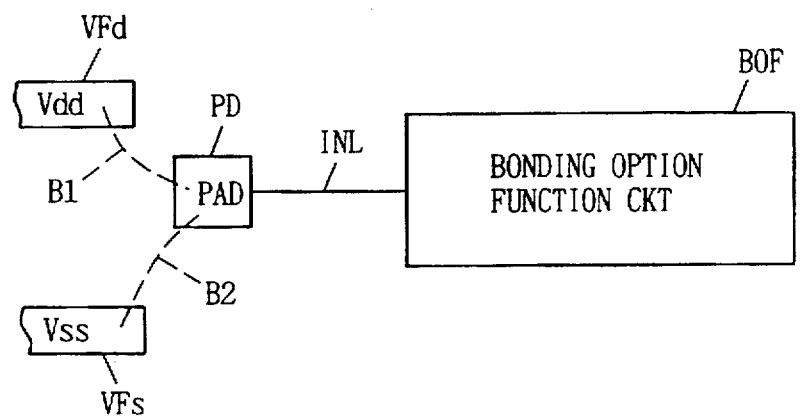
FIG. 15 schematically shows an arrangement of a main portion of a conventional semiconductor device.

FIG. 14 schematically shows another arrangement of the semiconductor device in accordance with the present invention. Referring to FIG. 14, the semiconductor device includes a bonding option function circuit 82, the internal function implemented by which is set by the set potential of pad 80. The bonding option function circuit 82 may be a data input/output circuit whose word configuration is determined in accordance with the set potential of pad 80, or it may be a refresh address circuit component of which refresh cycle number (in case of a DRAM) is set, or it may be a circuit of which data output mode (EDO mode or static column mode, or its operation mode such latch output mode, registered output mode and transparent output mode, for setting data output timing) set in accordance with the set potential of pad 80.

The semiconductor device further includes a check instruction signal generating circuit 84 for generating the check instruction signal TE in accordance with the state of the output signal, and a checking circuit 86 receiving the potential on pad 80 (signal PS) and the check instruction signal TE from check instruction signal generating circuit 84, which is activated when the check instruction signal TE is active, for electrically connecting an internal line 89 to a prescribed reference potential source (a node supplying the power supply voltage Vdd or the node supplying the ground voltage Vss) in accordance with the logic of the signal PS. The internal line 89 electrically connects an internal circuit 88 to an external pin terminal 92 through a pad 90. Internal circuit 88 may be any circuit provided that current path is not formed from internal line 89 through internal circuit 88 when the checking circuit 86 is active. Therefore, internal circuit 88 may be not only a signal input circuit but also an output circuit which is set to the output high impedance state when not in operation. When the internal function is determined in accordance with the set potential of pad 80 as in the semiconductor device shown in FIG. 14, it is possible to externally identify whether the semiconductor device is set to a prescribed internal function, that is, whether the internal function is implemented or not, easily, by using checking circuit 86.

Here, when the potential of pad 22 or 80 is set, an arrangement may be used in which pad 22 or 80 is selectively connected electrically to the power supply pin terminal or the ground pin terminal through a bonding wire. Alternatively, only one pin terminal (power supply pin or ground pin) may be provided near pad 22 or 80, and the potential of the special pad may be set in accordance with presence/absence of bonding connection to the pin terminal nearby.

More specifically, an arrangement may be used in which the potential of pad 22 or 80 is set to the level of the power supply potential when there is not a bonding wire, and the potential of pad 22 or 80 is set to the level of the ground potential when pad 22 or 80 is connected to a ground terminal, which is provided nearby, by the bonding wire. The potential of pad 22 or 80 may be set in the step of bonding, and the internal function is set accordingly.

As described above, according to the present invention, in an arrangement in which internal function is set in accordance with a potential of a special pad, a normal pad to which a predetermined internal circuit is connected is electrically connected internally to reference potential source in accordance with the potential of the special pad and to a check mode instruction, and a leak current of a pin terminal connected to the normal pad is detected externally. Therefore, the potential of the special pad, that is, the set internal function can be readily identified.

Further, when two pads are used and adapted such that one of the two pads is electrically connected to the reference potential source node in accordance with the potential of the special pad, the potential of the special pad, that is, the set internal function can be surely identified by determining to which of the terminals the leak current flows.

Further, by connecting the normal pad to one of first and second reference potential sources selectively in the check mode in accordance with the potential of the special pad, the potential of the special pad, that is, the internal function can surely be detected by detecting the direction of the leak current using only one pad.

Further, if the internal function is a slew rate control function for adjusting speed at the output node of the output circuit, it is possible to easily identify the internal function which cannot be readily detected in normal operation by a simple test, and hence erroneous delivery of products can surely be prevented.

Further, by using a burn-in mode detection signal as the check instruction signal, it becomes unnecessary to especially provide a detection circuit for setting the check mode, the internal function can be identified together in the burn-in mode, and therefore, a dedicated tester or test mode is not necessary. This means that efficiency in testing is not degraded. Further, it is not necessary to provide an existing mode detection circuit in the semiconductor device, and hence area occupied by the checking circuit in the semiconductor device can be reduced.

Further, the internal function can be identified by simply detecting presence/absence of the leak current at the external pin terminal, and hence internal function can be detected in non-destructive manner easily.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device of which internal function is determined in accordance with a potential of a special pad, comprising:

a normal pad provided separate from the special pad, electrically connected to an internal circuit; and checking means receiving a check instruction signal and a potential of said special pad, activated when said check instruction signal is active, for electrically connecting said normal pad to a reference potential source node selectively in accordance with the potential of said special pad.

2. The semiconductor device according to claim 1, wherein said normal pad includes
      a first pad electrically connected to a first internal circuit, and
      a second pad provided separate from said first pad and electrically connected to a second internal circuit;
   said checking means includes
      first means receiving said check instruction signal and said potential of said special pad for electrically connecting said first pad to said reference potential source node in accordance with the potential of said special pad when said check instruction signal is active, and
      second means operating complementarily to said first means in accordance with the potential of said special pad when said check instruction signal is active, for electrically connecting said second pad to said reference potential source node.

3. The semiconductor device according to claim 1, wherein said checking means includes
      first means for electrically connecting said normal pad to a first reference potential source node when said check instruction signal is active in accordance with the potential on said special pad, and
      second means operating complementarily to said first means in accordance with the potential of said special pad when said check instruction signal is active, for electrically connecting said normal pad to a second reference potential source node of a potential level different from the potential level of said first reference potential source node.

4. The semiconductor device according to claim 1, wherein said semiconductor device is a memory device storing data in retrievable manner, and said internal function is a speed of change in potential at an output node of an output circuit for outputting data to outside of the device.

5. The semiconductor device according to claim 1, wherein said memory device is a clock synchronous type static random access memory for taking in a signal and data externally in synchronization with a clock signal repeatedly applied from the outside, and said check instruction signal is also used as a burn-in mode detection signal from burn-in mode detecting means for detecting whether or not a burn-in mode is designated.

6. A method of identifying an internal function of a semiconductor device of which internal function is determined in accordance with a potential of a special pad, comprising the steps of:

applying a check instruction signal to said semiconductor device;

measuring a leak current generated at a pin terminal electrically connected to a predetermined internal circuit of said semiconductor device; and identifying an internal function set in said semiconductor device in accordance with the leak current value measured in the step of measuring; wherein said semiconductor device includes means for selectively and electrically connected to said prescribed pin terminal to an internal reference potential source node in accordance with the potential of said special pad when said check instruction signal is applied.

* * * * *